(12) United States Patent
Matsuda et al.

(10) Patent No.: US 8,742,289 B2
(45) Date of Patent: Jun. 3, 2014

(54) LASER LIFT-OFF APPARATUS

(75) Inventors: Ryozo Matsuda, Tokyo (JP); Keiji Narumi, Shizuoka (JP)

(73) Assignee: Ushio Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 13/813,645

(22) PCT Filed: Sep. 28, 2010

(86) PCT No.: PCT/JP2010/066793
§ 371 (c)(1),
(2), (4) Date: Jan. 31, 2013

(87) PCT Pub. No.: WO2012/017565
PCT Pub. Date: Feb. 9, 2012

(65) Prior Publication Data
US 2013/0128910 A1    May 23, 2013

(30) Foreign Application Priority Data

Aug. 4, 2010 (JP) ................................. 2010-175245

(51) Int. Cl.
*H01L 21/306* (2006.01)
*B23K 26/067* (2006.01)
*B23K 26/073* (2006.01)
*B23K 26/36* (2014.01)

(52) U.S. Cl.
USPC ................................. 219/121.77; 219/121.73

(58) Field of Classification Search
CPC ............. H01L 21/306; B23K 26/0054; B23K 26/067; B23K 26/073; B23K 26/36
USPC .......... 219/121.65–121.77; 438/458; 156/712
See application file for complete search history.

(56) References Cited

U.S. PATENT DOCUMENTS

| | | | | |
|---|---|---|---|---|
| 5,365,051 | A * | 11/1994 | Suzuki et al. | 250/201.2 |
| 6,559,075 | B1 | 5/2003 | Kelly et al. | |
| 7,202,141 | B2 * | 4/2007 | Park et al. | 438/458 |
| 7,364,986 | B2 * | 4/2008 | Nagai et al. | 438/463 |
| 2003/0104678 | A1 | 6/2003 | Kelly et al. | |
| 2003/0150843 | A1 | 8/2003 | Doi et al. | |

(Continued)

FOREIGN PATENT DOCUMENTS

| JP | 2001-501778 A | 2/2001 |
|---|---|---|
| JP | 2003-168820 A | 6/2003 |

(Continued)

OTHER PUBLICATIONS

Taiwan Intellectual Property Office (TIPO), Office Action for Taiwanese Patent Application No. 099136705, Jan. 10, 2012.

(Continued)

*Primary Examiner* — Samuel M Heinrich (57) ABSTRACT

In order to separate a material layer from a substrate at the boundary face between the substrate and the material layer, a laser light is applied to a workpiece from the substrate side through a mask, the work having the material layer formed on the substrate. The laser beam is split into a plurality of small area laser light by the mask 44, and two or more irradiation regions are formed on the workpiece. Adjacent irradiation regions are separated from each other, and an edge part of each irradiation region and an edge part of an adjacent irradiation region, which extend in a direction parallel to the relative moving direction of the workpiece, are arranged such that the edge of the irradiation region and the edge of the adjacent irradiation region are sequentially overlapped each other as the work is moved.

4 Claims, 12 Drawing Sheets

(56) References Cited

U.S. PATENT DOCUMENTS

| | | |
|---|---|---|
| 2003/0170963 A1 | 9/2003 | Voutsas et al. |
| 2004/0072382 A1 | 4/2004 | Kelly et al. |
| 2004/0101998 A1 | 5/2004 | Voutsas et al. |
| 2006/0040468 A1 | 2/2006 | Kelly et al. |
| 2008/0164571 A1 | 7/2008 | Kelly et al. |
| 2009/0050915 A1 | 2/2009 | Yamamoto |

FOREIGN PATENT DOCUMENTS

| | | |
|---|---|---|
| JP | 2003-282441 A | 10/2003 |
| JP | 2007-149988 A | 6/2007 |
| JP | 2007-534164 A | 11/2007 |
| WO | 2005/094320 A2 | 10/2005 |

OTHER PUBLICATIONS

Taiwan Intellectual Property Office (TIPO), Search Report for Taiwanese Patent Application No. 099136705, Jan. 10, 2012.
International Search Report, Oct. 26, 2010.
Japan Patent Office, Office Action, Oct. 19, 2010.

* cited by examiner

FIG. 13

LASER LIFT-OFF APPARATUS

TECHNICAL FIELD

The present invention relates to a laser lift-off apparatus in a manufacturing process of a semiconductor light emitting element, which is formed of a compound semiconductor, for separating a crystalline layer from a base plate by irradiating the crystalline layer formed on the base plate with laser light, thereby breaking down the crystalline layer (hereinafter referred to as a laser lift-off). In particular, the present invention relates to a laser lift-off apparatus, in which a workpiece is irradiated through a base plate with pulsed laser light, which is emitted through a laser emitting portion, and a crystalline layer is separated from the base plate on a boundary face between the base plate and the crystalline layer, while changing from moment to moment a region of the workpiece irradiated with the pulsed laser light.

BACKGROUND ART

In a manufacturing process of a semiconductor light emitting element, which is formed of GaN (gallium nitride) series compound semiconductor, there is known a technique of a laser lift-off for separating a crystalline layer of a GaN series compound, which is formed on a sapphire base plate, therefrom by irradiation with laser light from a back side of the sapphire base plate. Hereinafter, a laser lift-off refers to separation of such a crystalline layer (hereinafter referred to as a material layer), which is formed on a base plate, from the base plate by irradiating the material layer with laser light. For example, Patent Literature 1 discloses a GaN layer is formed on a sapphire base plate, and GaN, which forms the GaN layer, is broken down by irradiating it with laser light from a back side of the sapphire base plate, so that the GaN layer is separated from the sapphire base plate. A piece, in which the material layer is formed on the base plate, is referred to as a workpiece.

Figure 12:
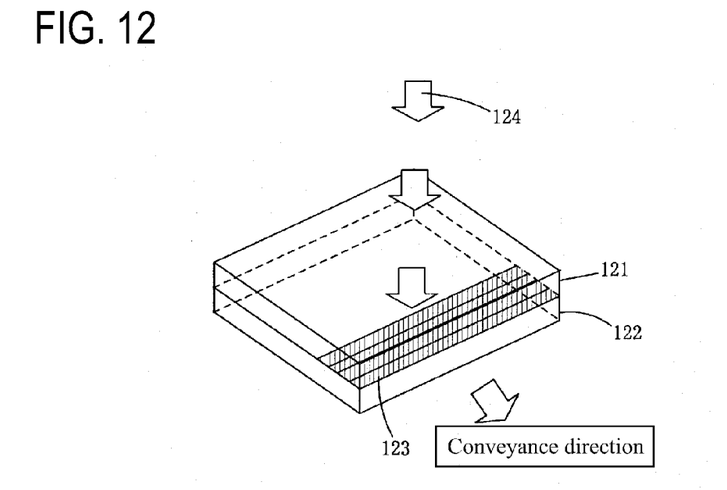
FIG. 12 It is a diagram for explaining the prior art in which irradiation is made from a back face of a base plate, while moving linear laser light in a longitudinal direction and a perpendicular direction of laser light.

Patent Literature 2 discloses a workpiece is irradiated with linear laser light over a sapphire base plate, while the workpiece is conveyed. Specifically, the literature teaches, as shown in FIG. 12, laser light 124 is formed so that an irradiation region 123 on a boundary face between a material layer 122 of a GaN series compound and a sapphire base plate 121 may be linear, and while moving the sapphire base plate 121 in a direction perpendicular to a longitudinal direction of the laser light 124, the sapphire base plate 121 is irradiated with the laser light 124 from a back side of the sapphire base plate 121. In order to separate the GaN series compound material layer from the sapphire base plate, it becomes important to irradiate the entire face of the workpiece with the laser light, which has irradiation energy required for breaking down the GaN series compound into Ga and N2.

CITATION LIST

Patent Literature

Patent Literature 1: Japanese Patent Application Publication No. 2001-501778
Patent documents 2: Japanese Patent Application Publication No. 2003-168820

DISCLOSURE OF INVENTION

Technical Problem

In the above mentioned laser lift-off treatment, time required for the laser lift-off (namely time required for irradiating the entire face of the workpiece with laser light) mainly depends on the irradiation area of the laser light, and the conveyance speed of the workpiece. The irradiation time of the laser light which is required for the treatment of the workpiece, will become short, if the irradiation area of the laser light on the workpiece is large and the workpiece is moved at high speed, and if it is the contrary, it will become long. However, there is a natural limit to the conveyance speed of the workpiece. Therefore, the time, which is required for the laser lift-off, mainly depends on the area of the workpiece which is irradiated with the laser light. However, when the area of the workpiece, which is irradiated with the laser light, is enlarged, there may be various difficulties, as explained below. That is, although the irradiation energy exceeding the breakdown threshold for breaking down the substance which forms the material layer, is needed for the laser light used for the laser lift-off, it is difficult to enlarge the irradiation area of laser light, while maintaining the irradiation energy required for the laser lift-off. When the present inventors carried out keen examination, in case where the irradiation area of the laser light on the workpiece was enlarged, it found out that damages such as cracks (break) were generated in the material layer at the time of a laser lift-off. As described above, the GaN of the material layer 2 is broken down into Ga and N2 by irradiating the material layer 2 with the pulsed laser light. Since N2 gas is produced when GaN is broken down, for example, shearing stress is applied to the GaN layer, and cracks are generated in a boundary part of the region irradiated with the laser light, so that the edge parts of the irradiated regions may be damaged. It is thought that the size of the damage due to this breakdown greatly depends on the irradiation area of laser light. That is, as the irradiation area S is larger, for example, the amount of produced N2 gas etc. is larger so that a larger force is applied to the edge part of the irradiated region of the pulsed laser light.

For the above-mentioned reason, it is desirable to make small the irradiation area of the laser light on a workpiece, in order to reduce the damage to the material layer at the time of laser lift-off. However, when the laser light irradiation area is made small, there is a problem that the irradiation time of the laser light, which is required for laser lift-off, becomes long. For example, under condition 1, which is described blow, the irradiation time of the laser light required for carrying out the laser lift-off on a workpiece of the φ2 inch (50.8 mm) is approximately 25 seconds. On the other hand, under condition 2, the irradiation time of the laser light required for carrying out laser lift-off on a workpiece of φ2 inches will be approximately 625 seconds.

(Condition 1)
The diameter of a workpiece is φ2 inches.
A region on the workpiece which is irradiated with laser light: a square of 1 mm
Frequency of pulsed laser light is 100 Hz
(Condition 2)
The diameter of a workpiece: φ2 inches
A region on the workpiece which is irradiated with laser light: a square of 0.2 mm
Frequency of pulsed laser light: 100 Hz As mentioned above, there is a problem that when an area irradiated with laser light is enlarged, damage to the material layer is increased while time required for a lift-off treatment becomes short, and when the irradiation area is made small, time required for the laser lift-off treatment is increased while the damage to the material layer becomes small, so that such conflicting problems arise.

Figure 13:
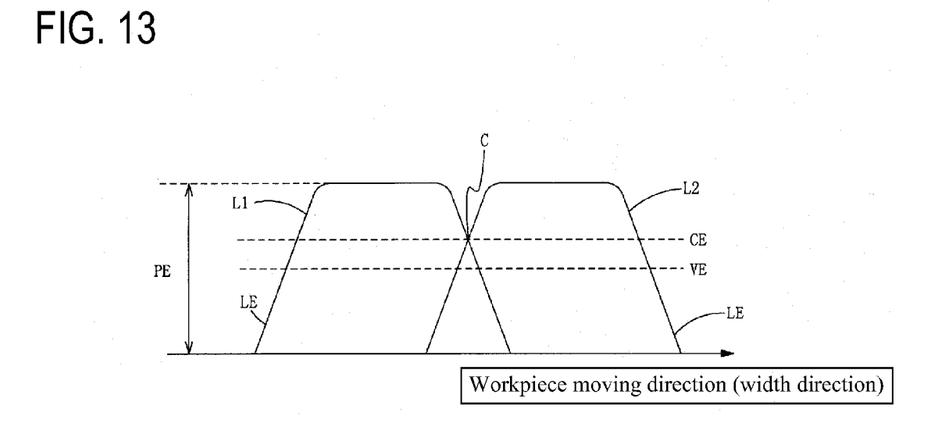
FIG. 13 It is a diagram showing light intensity distribution of laser light, with which irradiated regions adjoining each other, which are overlapped, are irradiated.

In order to lift off the GaN series compound material layer from a base plate, it is necessary to irradiate the entire workpiece with laser light which has irradiation energy more than the breakdown threshold required for breaking down a GaN compound into Ga and N2. If there is a region where the laser light having the irradiation energy more than a breakdown threshold is not irradiated, the unbroken-down region of GaN, which forms the material layer, is formed, and the material layer cannot be sufficiently separated from the base plate. For this reason, edge parts of adjoining irradiation regions should be overlapped in an energy region exceeding the breakdown threshold VE. FIG. 13 is a diagram showing an example of light intensity distribution of laser light, with which irradiated regions adjoining each other, are irradiated. In the figure, a vertical axis shows the intensity of laser light, with which each irradiated region of a workpiece is irradiated, and a horizontal axis shows a conveyance direction of a workpiece. Moreover, L1 and L2 respectively show profiles of laser light, with which irradiated regions of the workpiece are irradiated. As shown in FIG. 13, the laser lights L1 and L2 are overlapped in a region of energy, which exceeds the breakdown threshold VE required for breaking down the material layer of a GaN series compound thereby separating it from the sapphire base plate.

That is, at an intersection C of the laser lights L1 and L2 in the light intensity distribution of each laser light, the intensity of laser light (energy value) CE is set up so as to become a value, which exceeds the above-mentioned breakdown threshold VE. When the intensity CE of the laser light at the intersection C of the laser lights L1 and L2, that is, the intensity of each pulsed laser light on the region where the laser lights are superimposed and irradiated therewith, is set up so as to become a value exceeding the above-mentioned breakdown threshold VE, it is possible to apply laser energy to the material layer sufficient to separate the material layer from the base plate, so that the material layer can be certainly separated from the base plate, without causing cracks of the material layer formed on the base plate.

As mentioned above, in order to fully separate the material layer from the base plate without causing damage, although it is necessary to irradiate the entire face of the workpiece with laser light, so that the edge parts of adjoining irradiated regions may be overlapped in the energy region exceeding the breakdown threshold VE, and in addition, it is necessary to make the irradiation area of laser light small. However, if the irradiation area of laser light is made small, as mentioned above, there is a problem that time required for laser lift-off treatment becomes longer. The present invention is to solve the above-mentioned problem, and it is an object of the present invention to offer a laser lift-off apparatus, capable of performing a laser lift-off treatment for a short time, without producing cracks in a material layer formed on a base plate.

Solution to Problem

In order to solve the above-mentioned subject, according to the present invention, laser light emitted from a laser source is divided into two or more laser lights by using a laser light formation unit such as a mask, in which two or more small area laser light emitting portions for dividing the laser light are provided, whereby two or more small area irradiation regions, which are separated from one another on a workpiece, are formed. In addition, here, a region, which is irradiated with each laser light emitted from the two or more laser light emitting portions, is referred to as an irradiation region. And while the workpiece or the laser source (irradiated region) is relatively moved, one-time irradiation is performed on the workpiece with the laser light so that two or more irradiated regions which are separated from one another may be formed on the workpiece. In that case, adjoining irradiation regions are separated from each other and arranged aslant with respect to a moving direction of the workpiece, and the two or more irradiated regions are arranged, so that end portions of adjoining irradiated regions, which extend in parallel to the relative movement direction of the workpiece, are overlapped each other sequentially as it is moved. Furthermore, a conveyance speed of the workpiece 3 and an irradiation interval of pulsed laser light are set up so that edge portions of irradiated regions, which extend in a direction perpendicular to the conveyance direction of the workpiece, may be overlapped each other. That is, an end portion (edge part) of an irradiation region is overlapped with an end portion (edge part) of an adjacent irradiation region. Specifically, the irradiation regions formed on the workpiece (openings of a mask in case where the mask is used as a laser light formation unit), are arranged so as to be on a line, which is inclined with respect to the moving direction of the workpiece, or arranged in a staggered manner.

Figure 5:
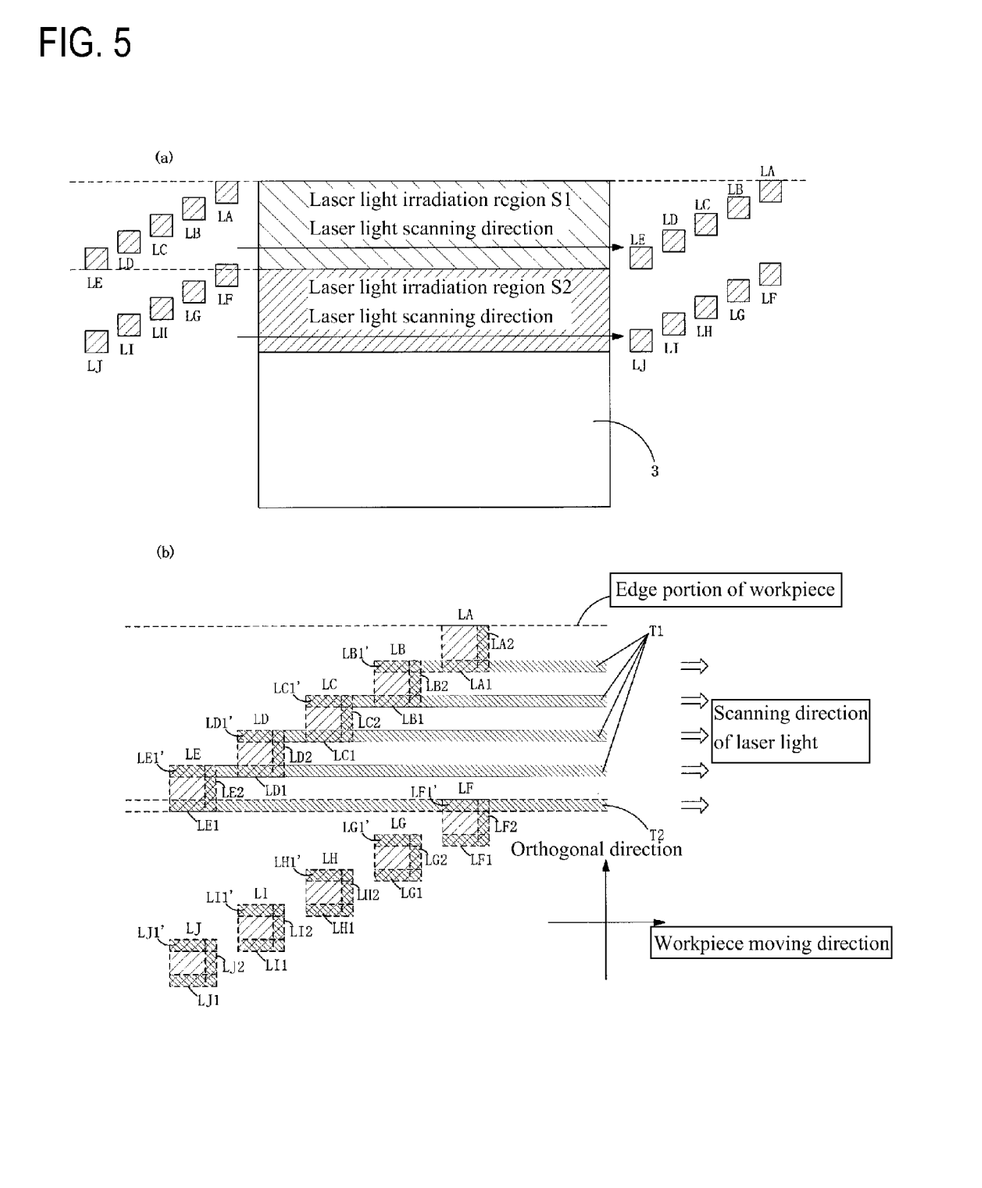
FIG. 5 It is a diagram showing a scanning direction of laser light on a workpiece and an irradiation pattern of laser light onto the workpiece.

In an embodiment described below, an example where a mask is used as a laser light formation unit, and two or more laser light emission units are openings formed in the mask, will be mainly explained. As shown in FIG. 5, which will be described below, an edge part LA1 of an irradiation region LA formed by laser light emitted from each of adjoining openings formed in the mask, is sequentially overlapped with an edge part LB1' of an irradiated region LB which adjoins in a direction perpendicular to a conveyance direction of a workpiece, at a short time interval, while the workpiece is conveyed. Much the same is true on LB-LJ. Moreover, the conveyance speed of the workpiece 3 and an irradiation interval of pulsed laser light are set up so that edge parts LA2 of the irradiation region LA, which extend in the direction perpendicular to the conveyance direction of the workpiece, may be overlapped each other. Much the same is true on LB-LJ. In such a way, this will become substantially the same as making the area of the laser irradiation regions of the workpiece large. In addition, since the workpiece is conveyed, the laser lights (LA, LB, etc. of FIG. 5), which are superimposed on the workpiece, illuminate it at a minute interval. In case where a material layer is made of a GaN (gallium nitride) series compound, time, for which the material layer returns to a room temperature after reaching temperature at which the material layer is broken down, is very short, and is approximately 100 µs in general. On the other hand, an irradiation interval of each of the laser lights LA and LB to illuminate the overlapped region T1 of FIG. 5 is far longer than 100 µs. That is, although the laser light overlapped region T1 shown in FIG. 5(b) is irradiated with the laser light LA after the laser light LB, the temperature of the region which is irradiated with the laser light LB has already dropped to the room temperature level at the time of irradiation of laser light LA. Therefore, since each irradiation energy of the laser lights LA and LB is not added together in the overlapped region T1, the irradiation region of the laser light emitted from each laser light emission unit becomes substantially small area, damage to the material layer will be reduced.

Advantageous Effects of Invention

In the laser lift-off apparatus according to the present invention, effects set forth below can be expected. (1) When a laser light formation unit divides laser light emitted from the source of laser into two or more laser lights so that two or more irradiation regions, which are separated from one another on the workpiece, are formed by the respective divided laser light, and one-time irradiation of the laser light is performed to the respective irradiation region on the workpiece, so that two or more irradiated regions can be irradiated with the laser light by irradiation of a one-time laser light. That is, since two or more irradiation regions can be irradiated with one-time laser light, even if the area of each irradiated region is made small, a laser lift-off treatment can be performed in a short period of time, so that a throughput can be improved. (2) Since edge parts of respective irradiated regions, which extend in a direction perpendicular to the conveyance direction of the workpiece, are overlapped each other, while edge parts of laser light emitted from respective adjoining laser light emitting parts, which extend in a direction parallel to a moving direction of the workpiece, are overlapped in series according to the movement of a workpiece, the entire workpiece can be irradiated with the laser light, which has the irradiation energy more than a breakdown threshold value required for breaking down a GaN series compound into Ga and N2, while each irradiated area made small. Moreover, as mentioned above, since laser light, with which overlapped regions are irradiated, is emitted at a time interval during which the temperature of the irradiation region sufficiently falls down, irradiation energy of each laser light, with which the overlapped region is irradiated, is not added together. Therefore, even if each irradiation region is overlapped, effects, which are substantially equal to those in case where irradiation of laser light is performed for each irradiation region, can be acquired. For this reason, damage to a material layer in case where separating the material layer from a base plate can be reduced.

DESCRIPTION OF EMBODIMENT

Figure 1:
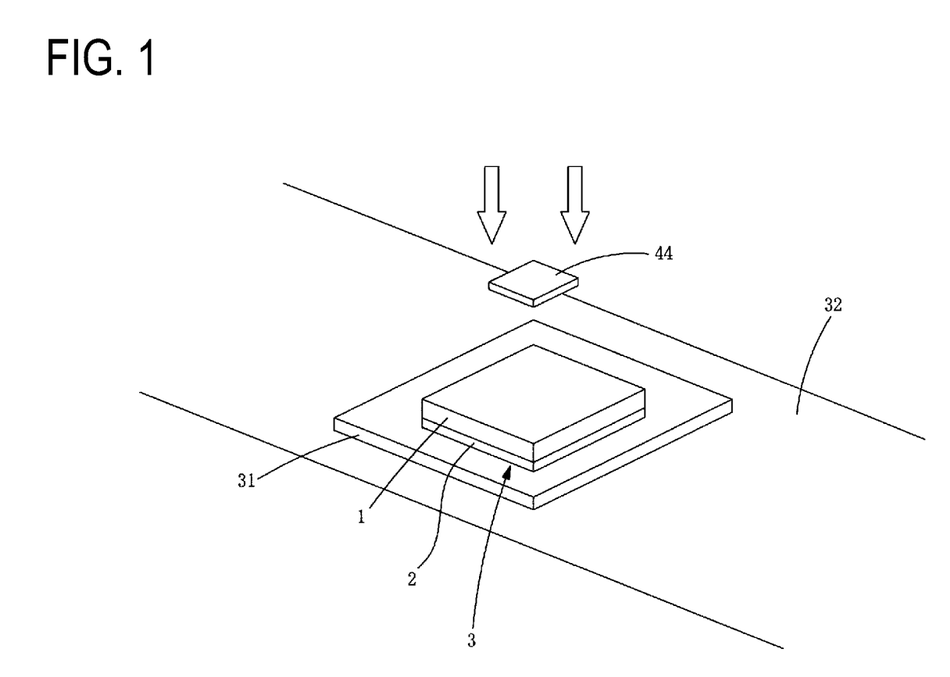
FIG. 1 It is a conceptional diagram showing the configuration of a laser lift-off treatment according to an embodiment of the present invention.

FIG. 1 is a conceptional diagram showing the configuration of a laser lift-off treatment according to an embodiment of the present invention. As shown in the figure, a workpiece 3, in which a material layer 2 is formed on a base plate 1 transmitting laser light, is placed on a workpiece stage 31. The workpiece stage 31, on which the workpiece 3 is put, is placed in a conveyance mechanism 32 such as a conveyor, and is conveyed at a predetermined speed by the conveyance mechanism 32. The workpiece 3 is irradiated with pulsed laser light L through the base plate 1, while it is conveyed together with the workpiece stage 31 in a predetermined direction. As to the workpiece 3, the material layer 2 made of a GaN (gallium nitride) series compound is formed on a surface of the base plate 1 made of sapphire. The base plate 1 may be any as long as the material layer made of the GaN series compound can be formed well thereon, and it transmits laser light of a wavelength required for breaking down the GaN series compound material layer. Such a GaN series compound is used for the material layer 2, in order that high output blue light or ultraviolet light may be efficiently outputted with low input energy.

The laser light should be suitably selected according to material which forms the base plate 1 and the material layer to be separated from the base plate 1. When the material layer 2 of the GaN series compound is separated from the base plate 1 made of sapphire, a KrF (krypton-fluorine) excimer laser, which emits pulsed laser light having a wavelength of, for example, 248 nm, can be used. Light energy (5 eV) of the laser wavelength of 248 nm is between the band gap (3.4 eV) of GaN and the band gap (9.9 eV) of sapphire. Therefore, laser light with the wavelength of 248 nm is desirable, in order to separate the material layer of the GaN series compound from the base plate of sapphire. Above the workpiece 3, a mask 44 for forming a predetermined laser light pattern of laser light L emitted from the laser source, is arranged. A projection lens described below is omitted in FIG. 1.

Figure 2:
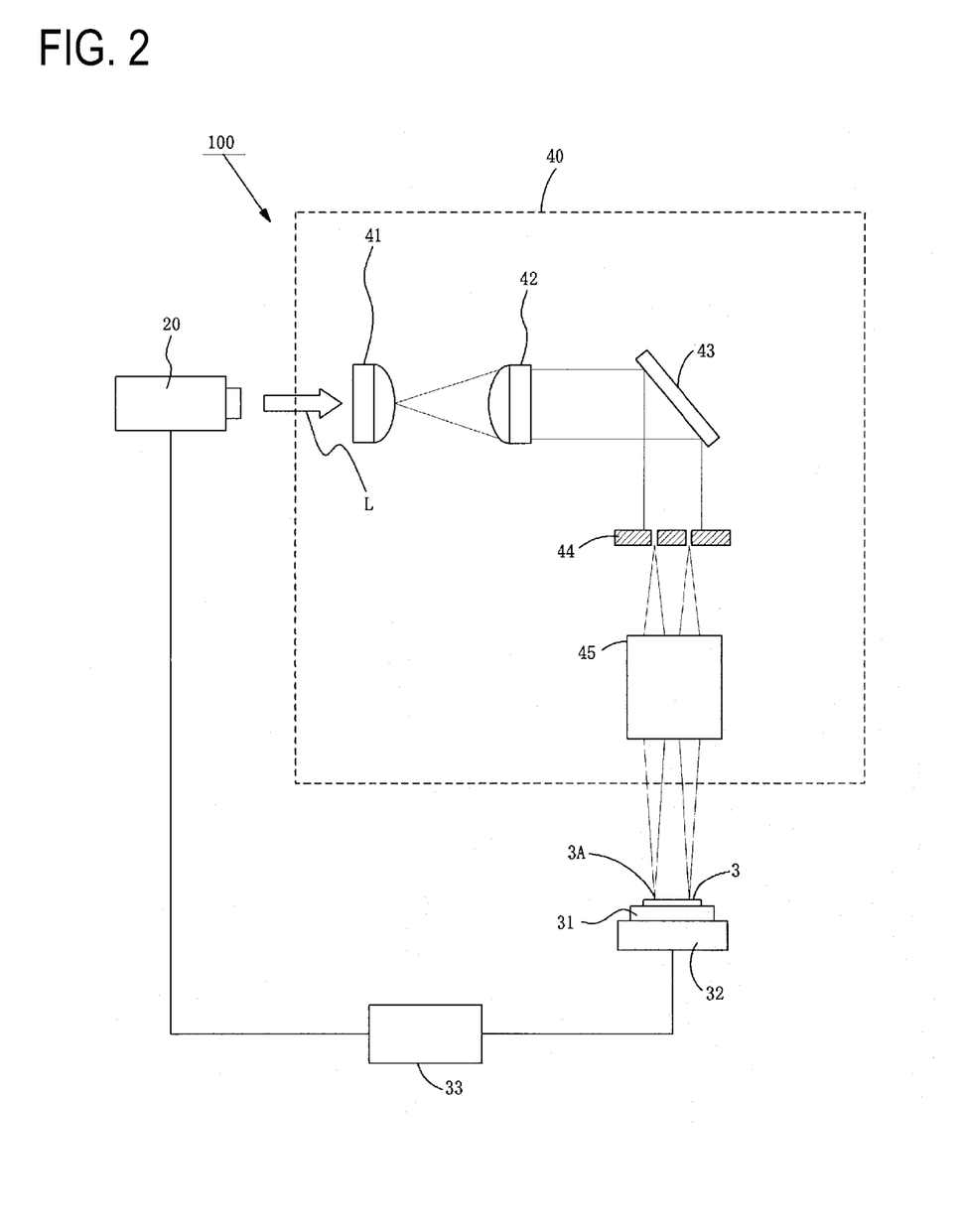
FIG. 2 It is a conceptional diagram of an optical system of a laser lift-off apparatus according to an embodiment of the present invention.

FIG. 2 is a conceptional diagram of an optical system of a laser lift-off apparatus according to an embodiment of the present invention. As shown in the figure, a laser lift-off apparatus 100 comprises a laser source 20 which generates pulsed laser light, a laser optical system 40 which generates laser light in a predetermined shape, the workpiece stage 31 on which the workpiece 3 is placed, the conveyance mechanism 32 which conveys the workpiece stage 31, and a control unit 33 for controlling an irradiation interval of the laser light, which is generated by the laser source 20, and an operation of the conveyance mechanism 32. The laser optical system 40 comprises cylindrical lenses 41 and 42, a mirror 43, which reflects the laser light toward the workpiece, a mask 44 which has openings for passing laser light therethrough, a projection lens 45, which projects an image of the laser light L, which has passed through the mask 44, on the workpiece 3. The mask 44 has two or more openings for dividing laser light, whereby the laser light emitted from the laser source 2 is divided into two or more laser lights, and two or more irradiation regions which are separated from each other, are formed on the workpiece by the respective divided laser lights. That is, the mask 44 functions as the laser light formation unit, and the two or more openings serve as laser light emitting parts. Arrangement, the shape, and the area of the irradiation regions of the workpiece 3, which is irradiated with pulsed laser light, can be suitably selected by selecting the arrangement, the shape, the size, etc. of the openings of the mask 44 which function as the above-mentioned laser light formation unit. The workpiece 3 is arranged downstream of the laser optical system 40. The workpiece 3 is placed on the workpiece stage 31. The workpiece stage 31 is placed in the conveyance mechanism 32, and is conveyed by the conveyance mechanism 32.

After pulsed laser light L generated in the laser source 20 passes through the cylindrical lenses 41 and 42, the mirror 43, and the mask 44, it is projected on the workpiece 3 by the projection lens 45. A boundary between the base plate 1 and the material layer 2 is irradiated with the pulsed laser light L through the base plate 1. In the boundary between the base plate 1 and the material layer 2, GaN of the material layer 2 near the boundary between the base plate 1 and the material layer 2 is broken down by irradiation of the pulsed laser radiation L. Thus, the material layer 2 is separated from the base plate 1.

Figure 3:
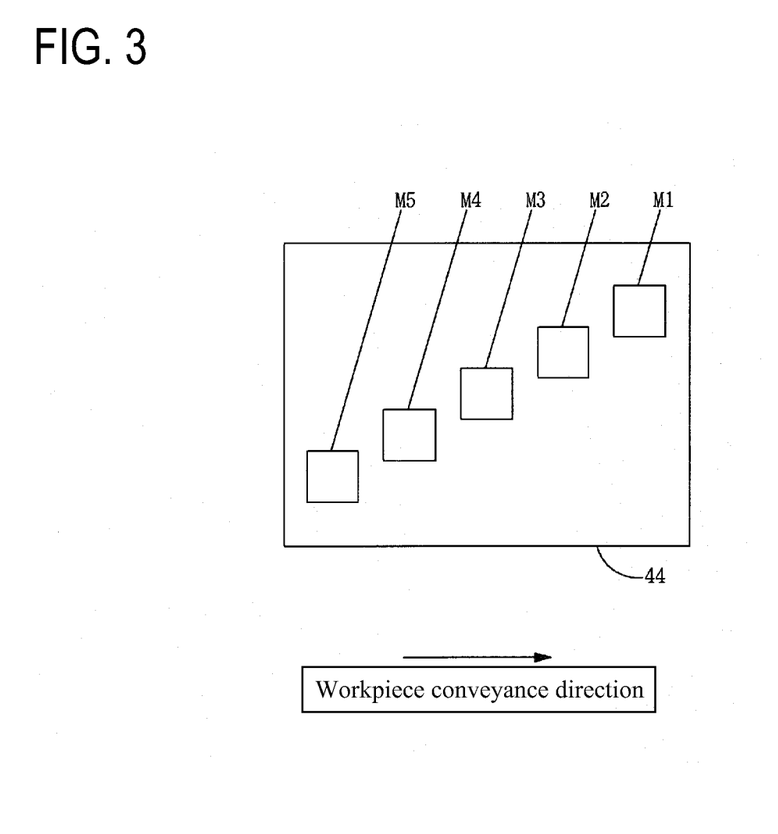
FIG. 3 It is a diagram showing a first embodiment of a mask used for a laser lift-off apparatus.
Figure 4:
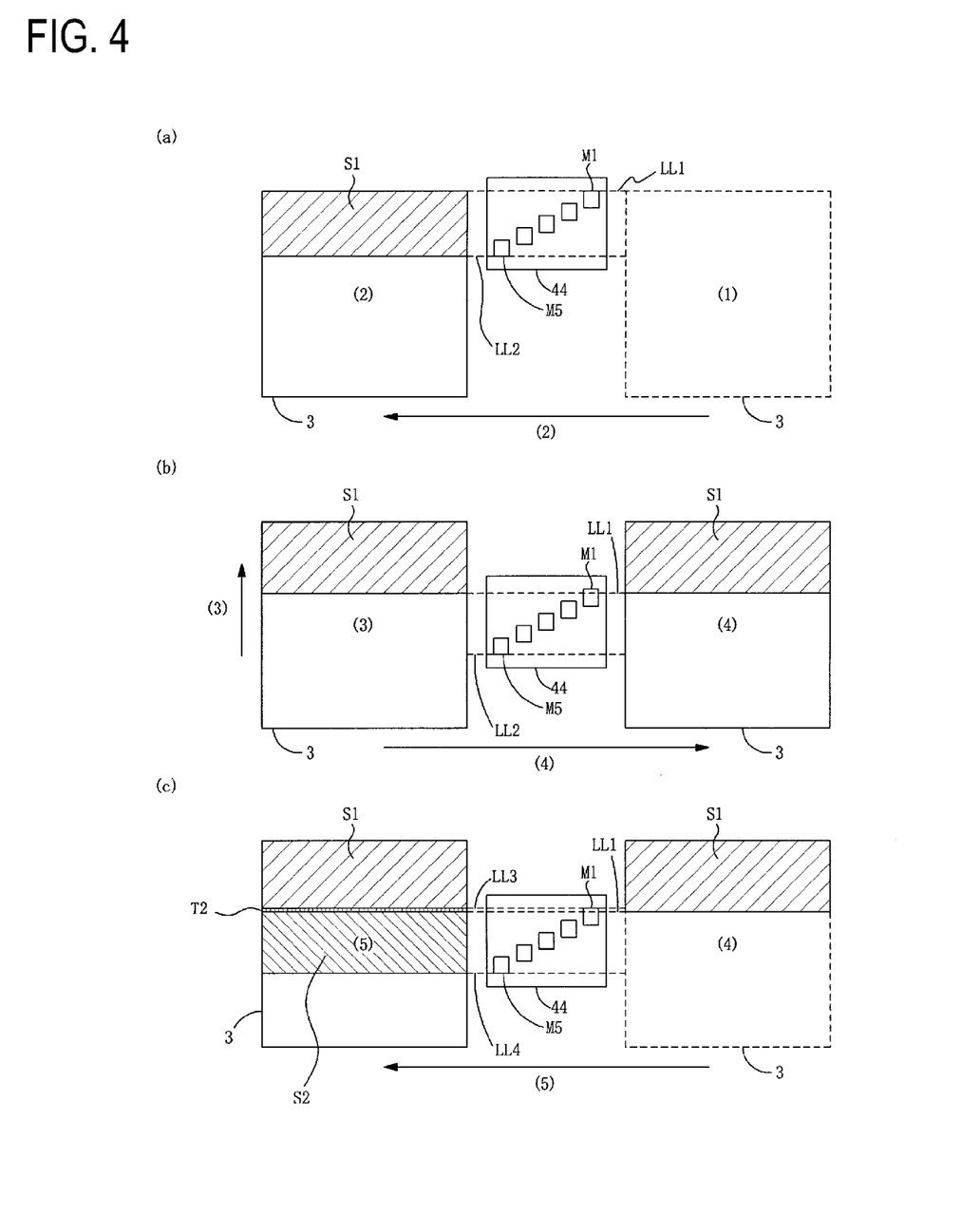
FIG. 4 It is a diagram for explaining a laser light emitting method according to a laser lift-off apparatus of an embodiment of the present invention.

FIG. 3 is a diagram showing the first embodiment of the mask with which the laser lift-off apparatus according to the present invention is equipped. As shown in FIG. 3, while two or more openings M1-M5 of the mask 44 according to the present invention, which serve as laser light emitting parts, are separated from one another in a metal plate, as shown in FIG. 4, which will be explained below, they are formed so as to be arranged on a straight line which inclines with respect to the conveyance direction (direction of an arrow shown in the figure) of the workpiece 3. As shown in FIG. 5, which will be explained below, when the workpiece 3 is conveyed to one way, the openings M1-M5, which serve as the respective laser light emitting parts, are formed so as not to be contiguous to one another and so as to be separated from one another so that edge parts of irradiation regions formed by laser lights emitted from adjoining laser light emitting parts (each of openings of the mask), the edge parts extending in a direction parallel to the conveyance direction of the workpiece 3, may be overlapped. The openings M1-M5, which are formed in the mask 44, divide the laser light emitted from the laser source, and form two or more irradiation regions separated from one another, and the area of each irradiation region is set so as to be 0.25 mm$^2$ or less when the shape of the irradiation region is close to, for example, a square.

If the irradiation area formed by the divided laser light is made small as mentioned above, it is possible to reduce damages applied to the material layer when the material layer is separated from the substrate. That is, as mentioned above, for example, although edge parts of the irradiation regions are damaged when GaN is broken down, that is, for example, shear stress is added to the GaN layer so that cracks are produced in the boundary part of the irradiation region of the laser light, the size of the damages due to the breakdown is deemed to greatly depend on the area to be irradiated with the laser light. As a result of examination made based on an experiment etc., it was confirmed that if the shape of the irradiation area on a workpiece, which is irradiated with the laser light, is close to a square as mentioned above, and if the irradiation area of the workpiece irradiated with the laser light is set to 0.25 mm$^2$ or less, it is possible to prevent generation of cracks in the material layer of the workpiece.

Figure 6:
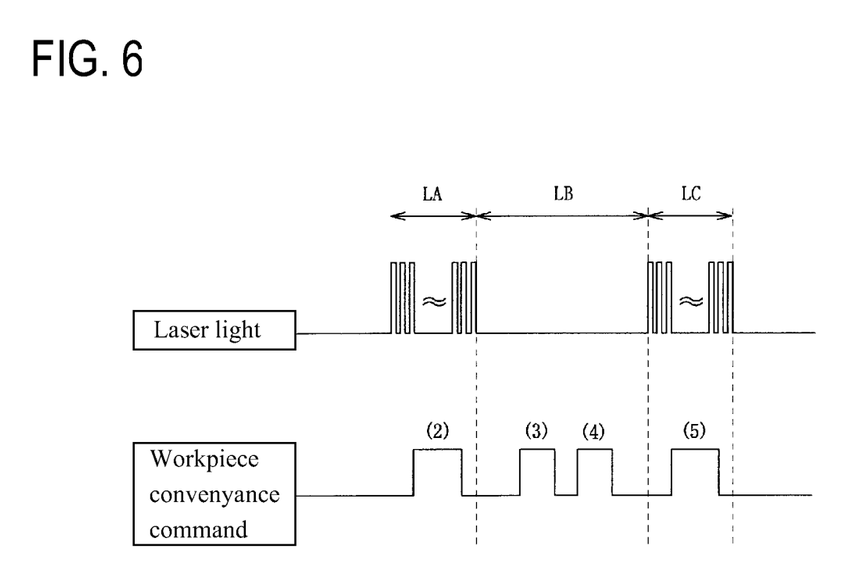
FIG. 6 It is a timing diagram showing irradiation of laser light, and pause timing.
Figure 7:
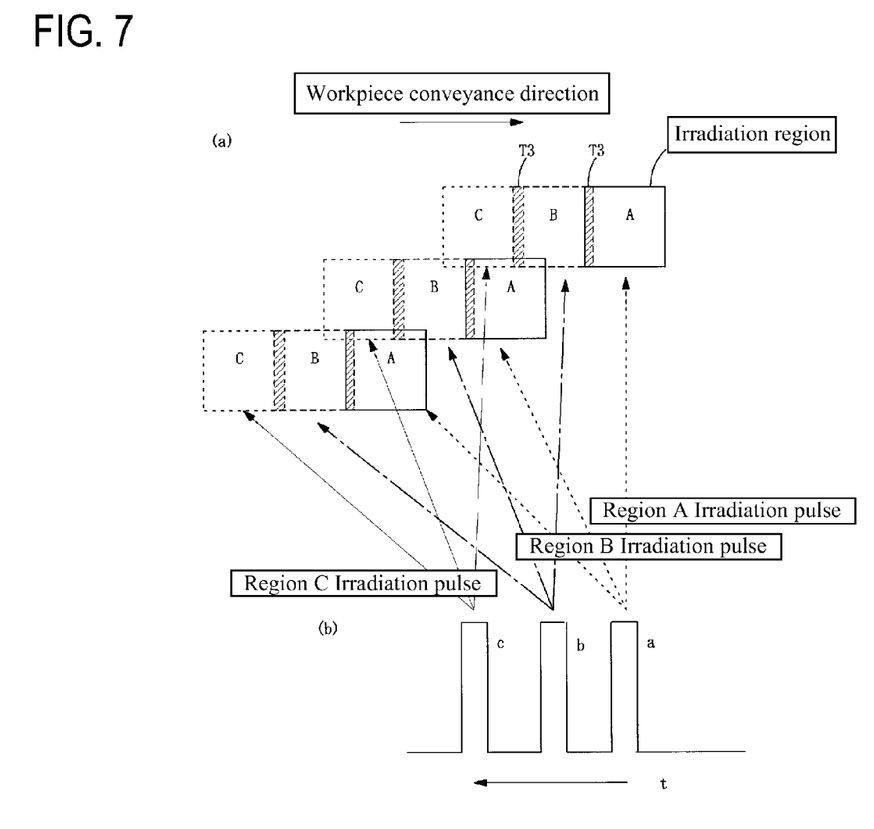
FIG. 7 It is a figure showing a relation between irradiation timing of pulsed laser light, and an irradiation region on a workpiece.

A laser light emitting method concerning a laser lift-off apparatus according to the present embodiment, will be described below. FIG. 4 is a diagram for explaining a laser light emitting method concerning a laser lift-off apparatus according to the present embodiment, wherein (a) shows a laser irradiation period, (b) shows a laser break period, and (c) shows a laser irradiation period. Moreover, numbers with parentheses in the figure show steps of procedure of laser light irradiation, wherein steps (2) and (5) are performed in a laser light irradiation period (refer to LA and LC of FIG. 6), and steps (3) and (4) are performed in a laser light break period (refer to LB of FIG. 6). FIG. 5 shows a scanning direction of laser light on a workpiece and the irradiation pattern of the laser light on the workpiece, and FIG. 6 is a timing diagram showing irradiation of laser light, and break timing. The (2), (3), (4), and (5) of FIG. 6 correspond to the irradiation period (2) and (5), and the break periods (3) and (4) of FIG. 4. Furthermore, FIG. 7 shows a relation between irradiation timing of pulsed laser light, and an irradiation region on the workpiece. In addition, although in the laser lift-off apparatus according to the present embodiment, a mask is not moved, but pulsed laser light is emitted while a workpiece is moved, for convenience of explanation, in FIG. 5, it is drawn as if laser light was scanned.

In the steps (1) of FIG. 4(a), the mask 44 is arranged so that the upper end of the openings M1, which is located in an uppermost position in the figure, may be placed on the same straight line as the upper end of the workpiece 3. In the step (2), the workpiece 3 is conveyed in one direction from a right side to a left side, while it is irradiated with laser light. Here, as shown in FIGS. 5(a) and (b), when laser light is passed through the mask 44 shown in FIG. 3, irradiation regions LA-LE formed by divided laser lights are arranged on a straight line, which is inclined with respect to the conveyance direction of the workpiece 3, and as shown in FIG. 4(a), the region S1 on the workpiece 3, which extends from the upper end of the opening M1 located uppermost of the mask 44, to the lower end of the opening M5 located downmost of the mask 44 (a virtual line LL2 of FIG. 4), is irradiated with the laser light from a left side of the workpiece 3 towards a right side thereof (a virtual line LL1 of FIG. 4).

As shown in FIG. 5(b), when the workpiece 3 is conveyed in one direction, in the irradiation regions LA and LB, LB, LC and LC, LD and LD, and LE, which are formed by the laser light emitted from the adjoining openings of the mask 44, edge parts LA1 and LB1' which extend in a direction parallel to the moving direction of the workpiece 3, are overlapped each other (much the same is true on LB, LC, LD, and . . . ), whereby irradiation is made so that the overlapped region T1 may be formed. Moreover, when the workpiece 3 is conveyed in the one direction, the conveyance speed of the workpiece 3 and the irradiation interval of pulsed laser radiation are set up so that edge parts LA2 LB2 and . . . of each irradiation region, which extend in a direction parallel to the conveyance direction of the workpiece 3, are overlapped each other. A pulse interval of laser light is set up shorter than the time required in order that the workpiece may move by a distance equivalent to a region irradiated with one shot of the laser light. For example, when the conveyance speed of the workpiece 3 is 100 mm/second and the width of the overlapped region ST of laser light is 0.1 mm, the pulse interval of the laser light is 0.004 second (250 Hz).

FIG. 7 shows a relation between irradiation timing of the pulsed laser light and irradiation regions on the workpiece, wherein (a) of the figure shows the irradiation regions on a workpiece, and (b) thereof shows each pulsed laser light. In the figure, irradiation regions of the workpiece are irradiated with the laser light in order of A, B and then C, wherein the irradiation region A is irradiated with the laser light a, the irradiation region B is irradiated with the laser light b, and the irradiation region C is irradiated with the laser light c. In FIG. 7, the pulsed laser light a passes through the opening of the mask 44, and illuminates the irradiation region A on the workpiece 3, and the workpiece 3 moves to a position where the irradiation region B in the figure is irradiated with laser light, during a period up to time when the following pulsed laser light b is emitted. And the following pulsed laser light b is emitted so that the irradiation region B on the workpiece 3 is irradiated therewith at such timing that the edge parts T3 of the irradiation region A and that of the irradiation region B, which extend (hatched portions in the figure) in a direction perpendicular to the conveyance direction of the workpiece 3, are overlapped. Similarly, the workpiece 3 moves to a position where the irradiation region C in the figure is irradiated with laser light, during a period up to time when the following pulsed laser light c is emitted, and the following pulsed laser light c is emitted so that at such timing that the edge parts of the irradiation region B and the irradiation region C (hatched portions in the figure) are overlapped.

Next, the steps (3) and (4) shown in FIG. 4 are performed during the break period of pulsed laser light (refer to FIG. 6), and a preparation for irradiating the next region of the workpiece 3 with laser light is made. In the step of (3), in order to irradiate the next region of the work with laser light, the workpiece 3 is conveyed during the break period of laser light in a direction of an arrow (3) shown in FIG. 4, by only a distance slightly shorter than the region S1 of FIG. 4(a), which has been irradiated with laser light. The reason why the conveyance distance of the workpiece 3 is made slightly shorter than the region S1 which has been irradiated with laser light, is to overlap with each other the regions S1 and S2, which are irradiated with laser light shown in FIG. 4(c) in the step (5) described below. In step (4), during the break period of pulsed laser light, the workpiece is conveyed from the left side to the right side according to an arrow (4) of FIG. 4, in order to conform the moving direction of the workpiece 3 with respect to the mask 44 and the moving direction of (2) with each other.

Next, in a step (5), the workpiece 3 is conveyed from the right side to the left side in one direction according to an arrow (5) of FIG. 4 while irradiating it with the laser light. As shown in FIG. 5(b), irradiation regions LF-LJ formed by the laser light are arranged on a straight line, which is inclined with respect to the conveyance direction of the workpiece 3, and the workpiece 3 is irradiated with the laser light from a left side thereof to a right side thereof, that is, in the same direction as that in the case where the region S1 of the workpiece 3 is irradiated with the laser light, whereby the region S2 on the workpiece 3, which extends from the upper end of the opening M1 located uppermost of the mask 44 (a virtual line LL3 of FIG. 4(c), to the lower end of the opening M5 located downmost of the mask 44 (a virtual line LL4 of FIG. 4(c)), is irradiated with the laser light. As shown in FIG. 5(b), in the irradiation regions LF and LG, LG and LH, LH and LI, and LI and LJ, which are formed by the laser lights emitted from the laser light emission units adjoining each other, are irradiated so that edge parts thereof which extend in a direction parallel to the moving direction of the workpiece may be overlapped each other. Moreover, in the step (3), the regions S1 and S2, which are irradiated with laser light, are overlapped by adjusting the conveyance distance of the workpiece 3 as mentioned above (overlapped region T2). Furthermore, as described as to FIG. 7, laser lights LF-LJ are irradiated so that the respective edge parts of irradiation regions, which extend in a direction perpendicular to the conveyance direction of the workpiece 3, may be overlapped each other. The entire surface of the workpiece 3 is irradiated with the laser light by repeatedly performing such steps (1)-(5).

In the above-mentioned embodiment, the mask 44 having two or more openings M1-M5 (equivalent to a laser light emission unit), which are separated from one another, are provided as a laser light formation unit, wherein the irradiation regions, which are separated from one another, are formed on the workpiece by divided laser lights LA-LE formed by the openings M1-M5 of this mask 44, and further edge parts of the irradiation regions formed by the laser light LA-LE emitted from the adjoining openings M1-M5, which extend in a direction parallel to the moving direction of the workpiece, are overlapped each other in series as the workpiece is moved in one direction so that one time irradiation is made on the workpiece. For this reason, a laser lift-off can be performed in a short time, and a throughput can be improved. In addition, as described above, in the above-mentioned embodiment, the respective laser lights LA-LE emitted from the laser light emission units, which are arranged so as to be separated from one another, are superimposed in series at an interval. For this reason, the irradiation energy of the respective divided laser light is not added together. For example, since time when the material layer returns from breakdown temperature to the room temperature, is very short although laser light LA is emitted after LB, the region, which has been irradiated by LB, is already in a room temperature status when LA is irradiated, so that the irradiation energy of the laser lights LA and LB is not added together. That is, since it is almost the same as the case where the workpiece is irradiated individually with each laser light which is formed by dividing it with the mask 44, the area of each laser irradiation region becomes small. For this reason, the damage to the material layer at time when the material layer is separated from the base plate, can be reduced. In addition, in the steps shown in FIG. 4, as shown in FIG. 5(a), although the scanning direction of the laser light with respect to the workpiece always becomes the same, it is not necessary to make the scanning direction always the same.

Figure 8:
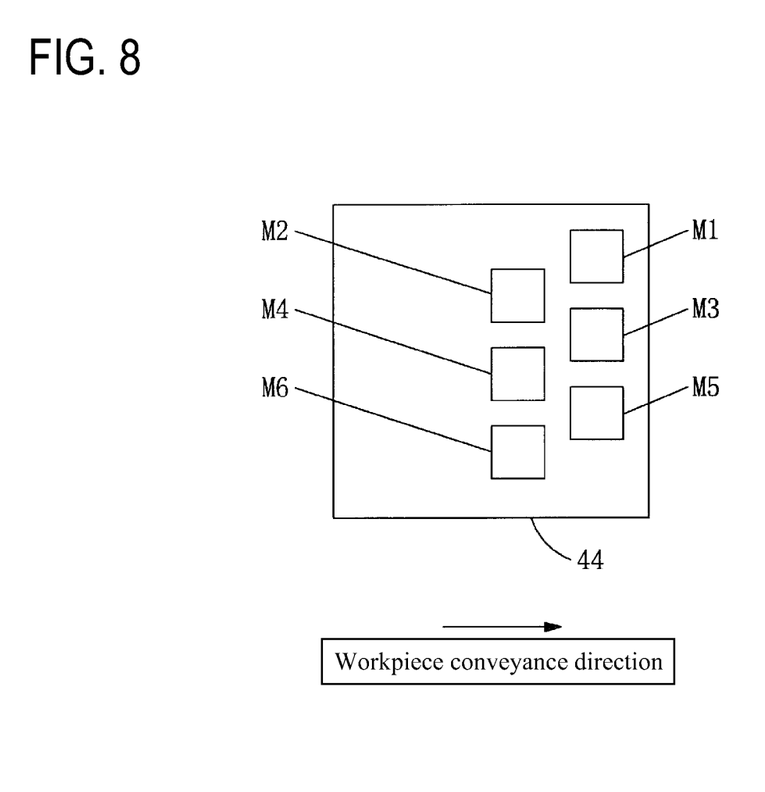
FIG. 8 It is a diagram showing a second embodiment of a mask used for a laser lift-off apparatus.

FIG. 8 is a diagram showing a second embodiment of a mask used for a laser lift-off apparatus. In the mask 44 shown in FIG. 8, the openings M1-M6, which serve as a laser light emission unit, are formed so as to be separated from one another, without being continuous from one another, and are arranged in a staggered manner. That is, at least two rows of one or plural openings are arranged in a linear arrangement in a direction perpendicular to the moving direction of a workpiece, and one of the rows of the openings and the other row of openings are arranged in an oblique direction with respect to the moving direction of the workpiece. Furthermore each of the openings M1-M6 are arranged so that edge parts of the irradiation regions formed by the laser light emitted from the openings (for example, openings M1 and M2) which adjoin in a direction perpendicular to the conveyance direction of the workpiece, may be overlapped when the workpiece 3 is conveyed, the edge parts thereof extending in a direction parallel to the conveyance direction of the workpiece 3. Even if the mask 44 in such a shape is used, as in the mask explained in the above-mentioned first embodiment, an end portions (edge part) of each irradiation region can be overlapped with an end portion (edge part) of an adjoining irradiation region, so that laser lift-off treatment can be performed in a short time as in the first embodiment, whereby the throughput thereof can be improved.

Figure 9:
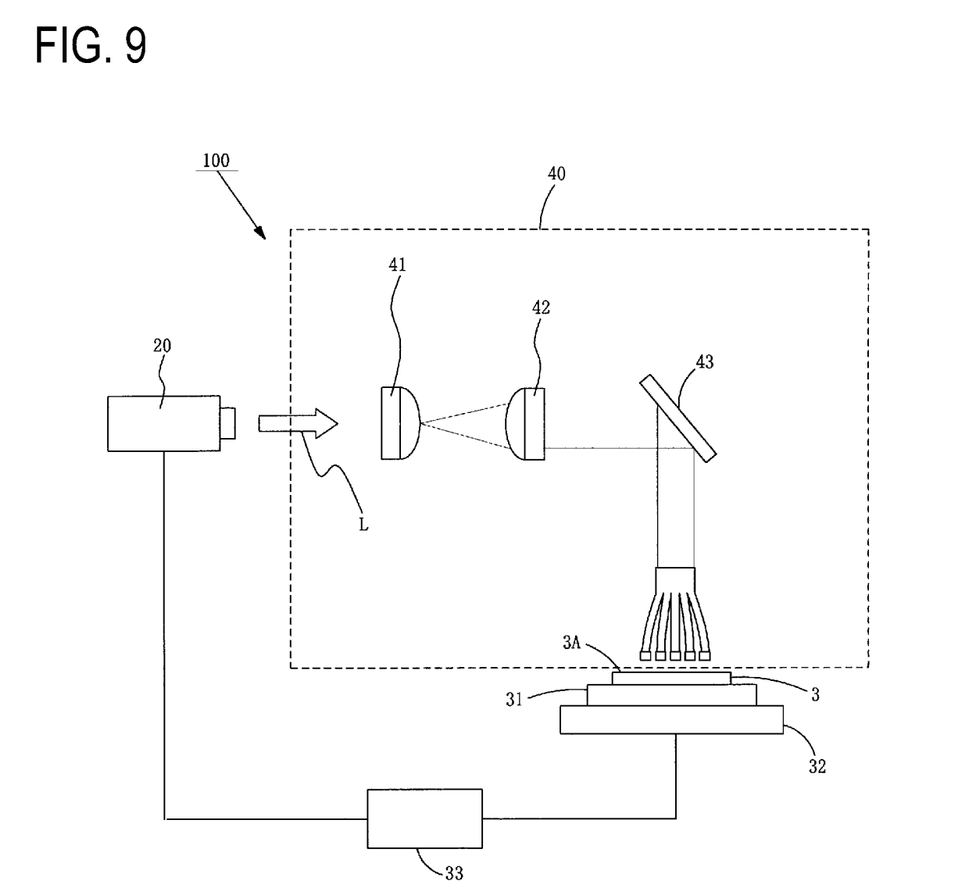
FIG. 9 It is a conceptional diagram of an optical system of a laser lift-off apparatus having a laser light formation unit according to another embodiment.
Figure 10:
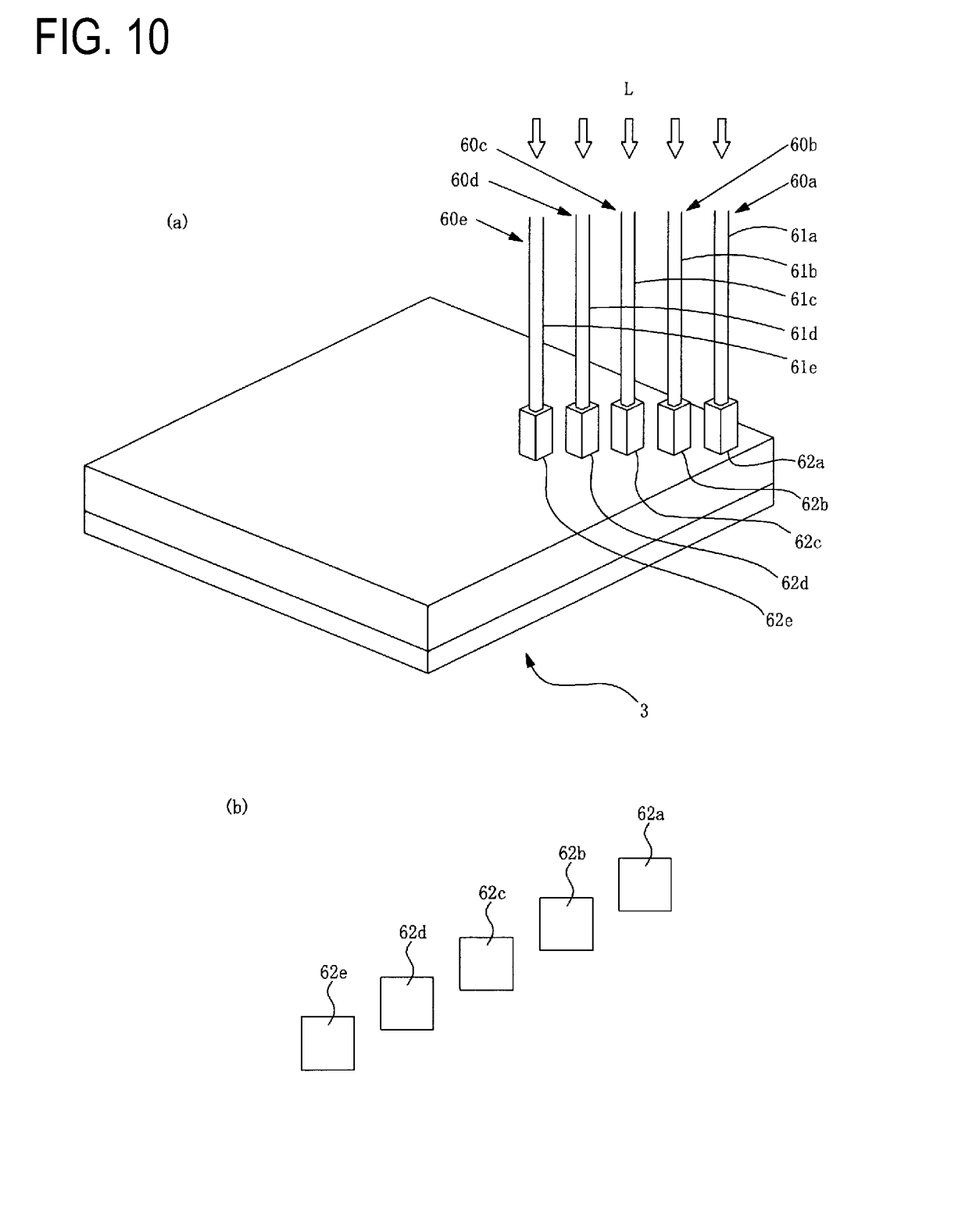
FIG. 10 It is a diagram showing another embodiment of a laser light formation unit.

FIG. 9 is a conceptional diagram of an optical system of a laser lift-off apparatus in which another laser light formation unit is used, and FIG. 10 is an enlarged view of the laser light formation unit shown in FIG. 9, wherein FIG. 10(a) shows an enlarged view of an area near a workpiece, and (b) in the figure shows an arrangement of light emission elements. In this embodiment, the laser light formation unit comprises light guiding portions 61a-61e, light emission elements 62a-62e, and optical fibers 60a-60e, and the laser light emission unit equivalent to the openings of a mask corresponds to the light emission elements 62a-62e. That is, as shown in FIGS. 10(a) and (b), the two or more light emission elements 62a-62e, are arranged on a straight line which inclines with respect to a conveyance direction of the workpiece 3, as in the openings M1-M5 of the mask shown in FIG. 3, and for example, as shown in FIG. 5, in irradiation regions formed by the laser lights emitted from the respective adjoining laser light emission units, the respective light emission elements 62a-62e are arranged so as to be separated from one another so that the edge parts extending in a direction parallel to the conveyance direction of the workpiece 3 may be overlapped, when the workpiece 3 is conveyed in one direction. In addition, in FIG. 10, although the light emission elements 62a-62e are arranged in a linear arrangement as in the openings M1-M5 of the mask shown in FIG. 3, they may be arranged in a staggered manner as shown in FIG. 8.

Figure 11:
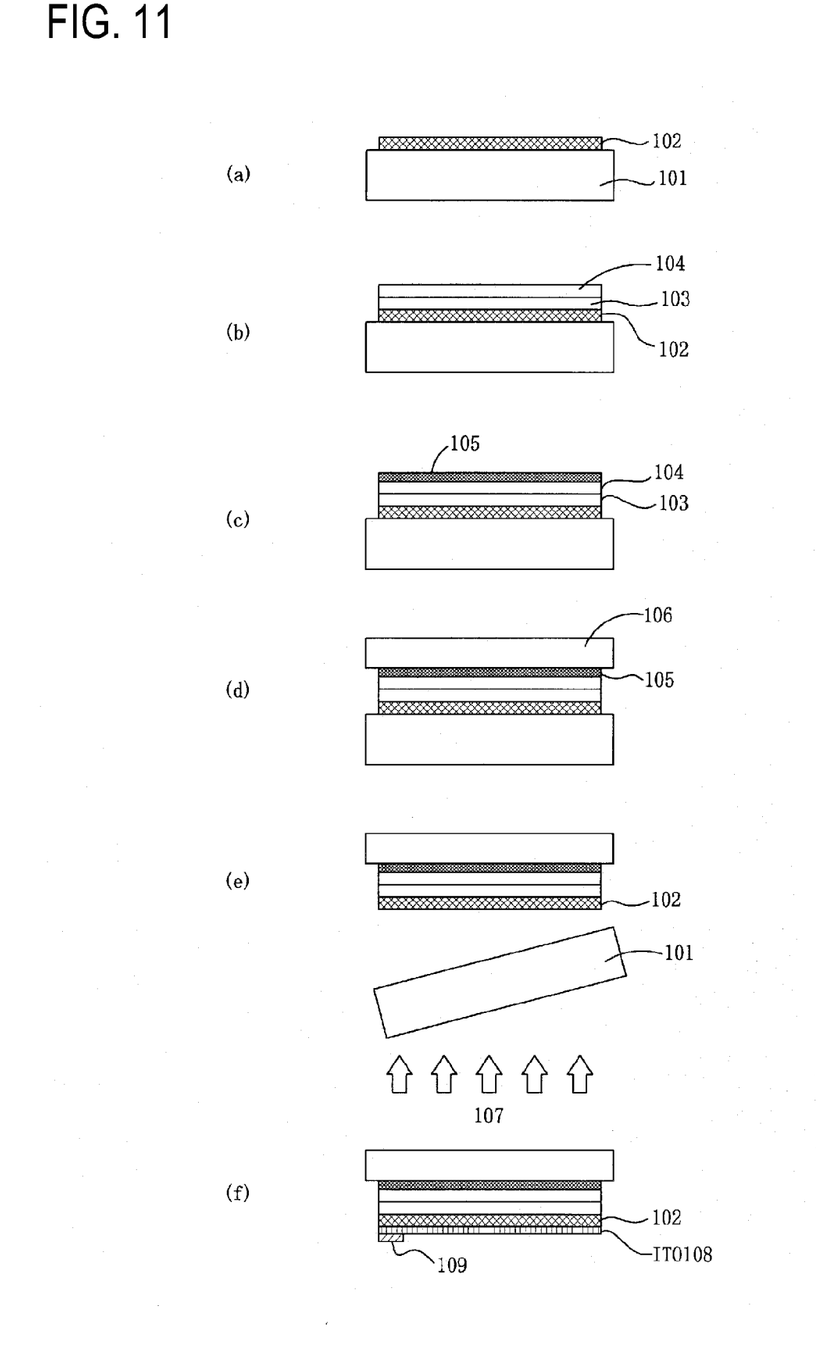
FIG. 11 It is a diagram explaining a method for manufacturing a semiconductor light emitting element, for which a laser lift-off apparatus of the present invention can be used.

Finally, description of method for manufacturing a semiconductor light emitting elements capable of using the above-mentioned laser lift-off apparatus will be given below. Hereinafter, the method for manufacturing such a semiconductor light emitting elements formed of a GaN series compound material layer, is explained referring to FIG. 11. A sapphire base plate capable of crystal growth of gallium nitride (GaN) series compound semiconductor, which transmits laser light and forms a material layer, is used as the base plate for crystal growth. As shown in FIG. 11(a), a GaN layer 102, which consists of a GaN series compound semiconductor, is quickly formed on a sapphire base plate 101 by, for example, using a metal-organic chemical vapor deposition (the MOCVD method). Then, as shown in FIG. 11(b), an n-type semiconductor layer 103 and a p-type semiconductor layer 104, which are light emitting layers, are laminated on a surface of the GaN layer 102. For example, GaN, in which silicon is doped, is used as the n-type semiconductor, and GaN, in which magnesium is doped, is used as the p-type semiconductor. Then, as shown in FIG. 11(c), a solder 105 is applied on the p-type semiconductor layer 104. Then, as shown in FIG. 11(d), a support base plate 106 is attached to the solder 105. The support base plate 106 is made of an alloy of copper and tungsten. And, as shown in FIG. 11(e), the laser light 107 is emitted towards a boundary face of the sapphire base plate 101 and the GaN layer 102 from a back side of the sapphire base plate 101. The boundary face of the sapphire base plate 101 and the GaN layer 102 is irradiated with the laser light 107, whereby the GaN layer 102 is separated from the sapphire base plate 101 by breaking down the GaN layer 102. An ITO108, which is a transparent electrode, is formed on a surface of the GaN layer 102 after the separation by vapor deposition, and an electrode 109 is attached to the surface of ITO108.

REFERENCE SIGNS LIST

1 Base Plate
2 Material Layer
3 Workpiece
10 Laser Lift-off Apparatus
20 Laser Source
31 Workpiece Stage
32 Conveyance Mechanism
33 Control Unit
40 Laser Optical Systems
41 and 42 Cylindrical Lens
43 Mirror
44 Mask
45 Projection Lens
60a-60e Fibers
61a-61e Light Guiding Portion
62a-62e Light Emission Element
101 Sapphire Base Plate
102 GaN Layer
103 N-type Semiconductor Layer
104 P-type Semiconductor Layer
105 Solder
106 Support Base Plate
107 Laser Light
108 Transparent Electrode (ITO)
109 Electrode
L, L1, L2 Laser Light
M1-M5 Opening of a Mask
LE Edge Part
VE Breakdown Threshold

The invention claimed is:

1. A laser lift-off apparatus comprising:
    a laser source for irradiating a workpiece, in which a base plate is formed on a material layer, with laser light passing through the base plate;
    a conveyance mechanism in which the workpiece and the laser source are moved relatively with respect to each other, and
    a laser light formation unit, which divides laser light emitted from the laser source into two or more laser lights, so that two or more irradiation regions, which are separated from each other by the respective divided laser light, are formed on the workpiece,
    wherein the two or more irradiation regions formed by the laser light formation unit, the area of which is 0.25 mm$^2$ or less, are arranged so that end portions of adjoining irradiation regions which extend in a direction parallel to a moving direction of the workpiece, are overlapped each other in series and end portions of adjoining irradiation regions which extends in a direction perpendicular to the moving direction, are overlapped, as the workpiece is moved in a one direction relatively to the laser source and an entire face of the workpiece is irradiated with the laser light.

2. The laser lift-off apparatus according to claim 1, wherein the laser light formation unit is a mask which has two or more rectangle openings.

3. The laser lift-off apparatus according to either claim 1 or 2, wherein the irradiation regions formed on the workpiece are arranged on a straight line, which is inclined with respect to the moving direction of the workpiece.

4. The laser lift-off apparatus according to either claim 1 or 2, wherein the irradiation region formed on the workpiece are arranged in a staggered manner.

* * * * *